(12) United States Patent
Zeng et al.

(10) Patent No.: US 11,271,183 B2
(45) Date of Patent: Mar. 8, 2022

(54) DISPLAY PANEL AND DISPLAY DEVICE

(71) Applicant: Shanghai Tianma Micro-Electronics Co., Ltd., Shanghai (CN)

(72) Inventors: Yang Zeng, Shanghai (CN); Feng Lu, Shanghai (CN); Haochi Yu, Shanghai (CN); Xiaoyue Su, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 151 days.

(21) Appl. No.: 16/601,196

(22) Filed: Oct. 14, 2019

(65) Prior Publication Data

US 2020/0343477 A1 Oct. 29, 2020

(30) Foreign Application Priority Data

Apr. 29, 2019 (CN) .......................... 201910357146.4

(51) Int. Cl.
| | |
|---|---|
| *H01L 51/00* | (2006.01) |
| *H01L 51/52* | (2006.01) |
| *G06F 1/16* | (2006.01) |
| *G06K 9/00* | (2022.01) |
| *G09G 3/3266* | (2016.01) |
| *G09G 3/3275* | (2016.01) |
| *H01L 27/32* | (2006.01) |
| *H01L 51/50* | (2006.01) |

(52) U.S. Cl.
CPC ........ *H01L 51/5237* (2013.01); *G06F 1/1626* (2013.01); *G06F 1/1637* (2013.01); *G06K 9/00046* (2013.01); *G09G 3/3266* (2013.01); *G09G 3/3275* (2013.01); *H01L 27/3211* (2013.01); *H01L 51/5096* (2013.01)

(58) Field of Classification Search
CPC .......................... H01L 27/14645–14647; H01L 27/3211–3218; H01L 27/323; H01L 27/3262; H01L 27/14678
See application file for complete search history.

(56) References Cited

U.S. PATENT DOCUMENTS

| | | | |
|---|---|---|---|
| 6,747,290 B2 * | 6/2004 | Yamazaki | ......... H01L 27/14678 257/59 |
| 2011/0001725 A1 * | 1/2011 | Kurokawa | .......... G06F 3/04166 345/174 |

(Continued)

*Primary Examiner* — Mary A Wilczewski
*Assistant Examiner* — Tsz K Chiu
(74) *Attorney, Agent, or Firm* — von Briesen & Roper, s.c.

(57) ABSTRACT

Provided are a display panel and a display device. The display panel includes a base substrate, drive circuits, a light-blocking layer, organic light-emitting units, and fingerprint recognition units. Via holes and imaging apertures are formed in the light-blocking layer. The via holes include first via holes in communication with the imaging apertures and second via holes. Each of the first organic light-emitting units includes a first anode, and each of the second organic light-emitting units includes a second anode. The first anode and the second anode are electrically connected to the drive circuits through the first via holes or through the second via holes. In a first direction, a distance between an edge of the first anode facing close to the imaging aperture and a center of the first via hole is smaller than a distance between an edge of the second anode and a center of the second via hole.

20 Claims, 18 Drawing Sheets

(56) References Cited

U.S. PATENT DOCUMENTS

| | | | |
|---|---|---|---|
| 2012/0032193 A1* | 2/2012 | Kurokawa | H01L 27/14623 257/84 |
| 2013/0037815 A1* | 2/2013 | Okajima | H01L 27/14678 257/59 |
| 2016/0093678 A1* | 3/2016 | Seo | H01L 51/5234 257/89 |
| 2016/0343949 A1* | 11/2016 | Seo | H01L 51/0052 |
| 2017/0186971 A1* | 6/2017 | Kanamoto | H01L 51/0071 |
| 2018/0039360 A1* | 2/2018 | Akimoto | H01L 51/5218 |
| 2018/0138416 A1* | 5/2018 | Seo | H05B 33/20 |
| 2019/0067385 A1* | 2/2019 | Xu | H01L 27/3244 |
| 2020/0104563 A1* | 4/2020 | Ryu | G06F 3/042 |
| 2020/0105841 A1* | 4/2020 | Bang | H01L 31/105 |
| 2020/0184178 A1* | 6/2020 | Zhou | H01L 27/3234 |

* cited by examiner

DISPLAY PANEL AND DISPLAY DEVICE

CROSS-REFERENCES TO RELATED APPLICATIONS

This application claims priority to Chinese patent application No. CN201910357146.4, entitled "Display Panel and Display Device" and filed on Apr. 29, 2019, disclosure of which is incorporated herein by reference in its entirety.

TECHNICAL FIELD

Embodiments of the present disclosure relate to the technical field of fingerprint recognition, and in particular, relate to a display panel and a display device.

BACKGROUND

Fingerprints are inherent and unique to every person. With the development of science and technology, various display devices having fingerprint recognition functions appear on the market. Such devices include mobile phones, tablet PCs, smart wearable equipment, etc. In this way, before operating a display device having the fingerprint recognition function, a user just needs to touch a fingerprint recognition module of the display device with a finger for the rights verification, thereby simplifying the rights verification process.

In the related display device having the fingerprint recognition function, a plurality of apertures for imaging can be disposed, and the light emitted by the light-emitting layer is reflected by the finger and imaged through the apertures, to achieve the fingerprint recognition. Due to the small opening area of the imaging aperture itself, and due to the blocking of other film layers, light transmitted through the aperture and reaching the fingerprint recognition unit is less, resulting in a lower sensitivity of fingerprint recognition.

SUMMARY

In view of the above, a display panel and a display device are provided to solve the technical problem, in the related art, that fingerprint recognition sensitivity is low due to less light reaching the fingerprint recognition unit through the imaging aperture.

In a first aspect, an embodiment of the present disclosure provides a display panel. The display panel includes a base substrate, a plurality of drive circuits, a light-blocking layer, a plurality of organic light-emitting units and a plurality of fingerprint recognition units located on a side of the light-blocking layer facing away from the organic light-emitting units. The base substrate, the plurality of drive circuits, the light-blocking layer, and the plurality of organic light-emitting units are successively stacked.

A plurality of via holes and a plurality of imaging apertures are formed in the light-blocking layer; the via holes include first via holes and second via holes, and at least one first via hole is in communication with one of the imaging apertures; and light reflected by a touch body is incident to one of the fingerprint recognition units through at least one of the imaging apertures.

The organic light-emitting units include first organic light-emitting units and second organic light-emitting units, each of the first organic light-emitting units includes a first anode, and each of the second organic light-emitting units includes a second anode; the first anode is electrically connected to one of the drive circuits through one of the first via holes, and the second anode is electrically connected to one of the drive circuits through one of the second via holes.

In a first direction, a distance between an edge on a side of the first anode facing close to one of the imaging apertures and a center of one of the first via holes is L1, a distance between an edge of the second anode and a center of one of the second via holes is L2, and L1<L2; and the first direction is parallel to a connection line between the center of the first via hole and the center of the imaging aperture.

In a second aspect, an embodiment of the present disclosure further provides a display device including the display panel described in the first aspect.

For the display panel and the display device provided in the embodiment of the present disclosure, the plurality of first via holes, second via holes and imaging apertures are disposed in the light-blocking layer located between the film layer in which the drive circuits are located and the film layer in which the organic light-emitting units are located. A first via hole is in communication with an imaging aperture. At the same time, in a direction parallel to the connection line between the first via hole and the center of the imaging aperture, the distance L1 between the edge on a side of the first anode facing close to the imaging aperture and the center of the first via hole and the distance L2 between an edge of the second anode and the center of the second via hole are set to satisfy that L1<L2, thus the imaging aperture is less covered by the first anode, the imaging aperture has a large light transmission region so that more of the light reflected by the finger is incident to the fingerprint recognition unit through the imaging aperture. Accordingly, the amount of optical signals received by the fingerprint recognition unit is increased, and the sensitivity of fingerprint recognition by the fingerprint recognition unit is improved.

BRIEF DESCRIPTION OF DRAWINGS

Other features, objects and advantages of the present disclosure will become more apparent from a detailed description of non-restrictive embodiments with reference to the drawings.

DETAILED DESCRIPTION

In order to make the objects, technical solutions and advantages of the present disclosure clearer, the technical solutions of the present disclosure will be described below in detail in conjunction with the drawings in the embodiments of the present disclosure and the specific embodiments. Apparently, the described embodiments are part, not all, of the embodiments of the present disclosure, and based on the embodiments of the present disclosure, other embodiments obtained by those skilled in the art on the premise that no creative work is done are within the scope of the present disclosure.

Figure 1:
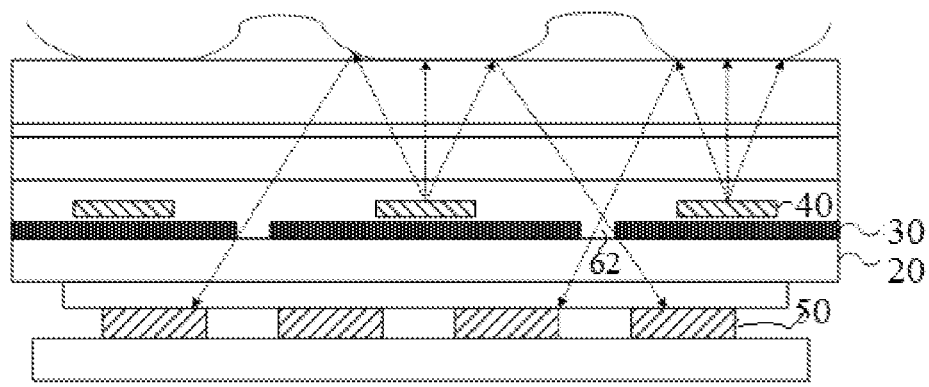
FIG. 1 is a schematic diagram illustrating a principle of fingerprint recognition through an imaging aperture in the related art.
Figure 2:
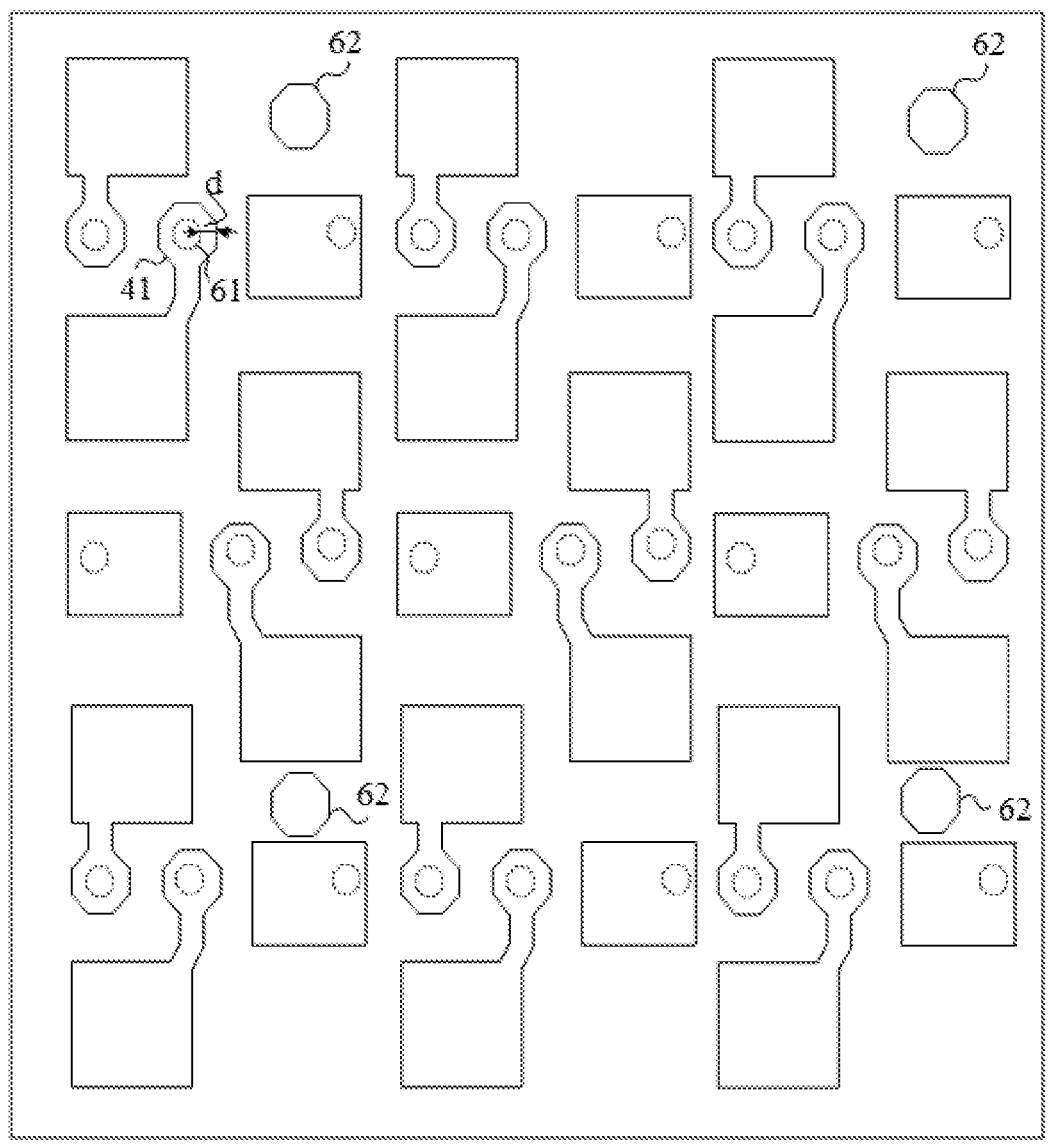
FIG. 2 is a structural diagram of a display panel in the related art.
Figure 3:
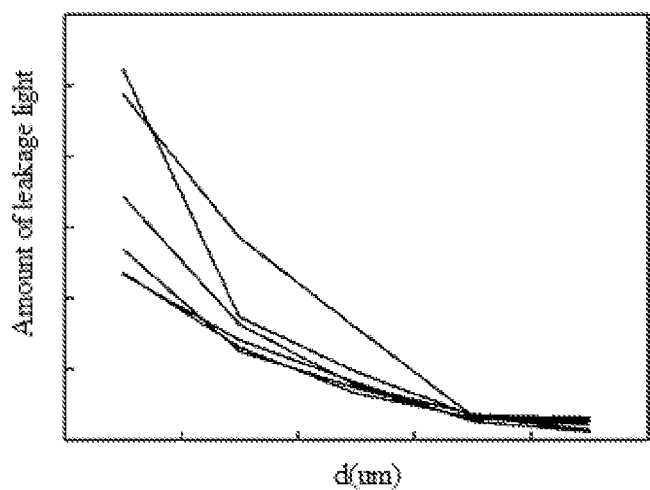
FIG. 3 is a graph illustrating variation of the amount of leakage light from a via hole with a distance between an edge of an anode and an edge of a via hole.

FIG. 1 is a schematic diagram illustrating a principle of fingerprint recognition through an imaging aperture in the related art. FIG. 2 is a structural diagram of a display panel in the related art. As shown in FIGS. 1 and 2, a light-blocking layer 30 is disposed between a drive circuit 20 and organic light-emitting units 40. A plurality of imaging apertures 62 are formed in the light-blocking layer 30. Light emitted from the organic light-emitting units 40 is reflected by a finger and reaches a fingerprint recognition unit 50 through one imaging aperture 62. The fingerprint recognition unit 50 is configured to perform fingerprint recognition based on the received light. Since the light-blocking layer 30 is provided between the drive circuit 20 and the organic light-emitting units 40, the light-blocking layer 30 needs to be provided with via holes 61 through which the drive circuit 20 is electrically connected to the organic light-emitting units 40. At the same time, in order to avoid impact on the fingerprint recognition accuracy due to the leakage of light from the via holes 61, an anode 41 of each organic light-emitting unit 40 is generally configured to completely cover the via hole 61 to reduce leakage of light from the via hole 61, and ensure that the light received by the fingerprint recognition unit 50 is from the imaging apertures 62. FIG. 3 is a graph illustrating variation of the amount of leakage light from a via hole with a distance between an edge of an anode and an edge of a via hole. As shown in FIG. 3, the amount of leakage light from the via hole 61 gradually decreases with an increase in a distance d between the edge of the anode 41 and the edge of the via hole 61. In order to reduce impact on the fingerprint recognition accuracy due to the leakage of light from the via hole 61, the distance d between the edge of the anode 41 and the edge of the via hole 61 is generally set to be large. When the distance d between the edge of the anode 41 and the edge of the via hole 61 is large, large space may be occupied. Thus, a technical problem may exist that a display opening ratio of the display panel is affected, a distance between adjacent anodes 41 is caused to be too close, and signals interfere with one another.

Figure 4:
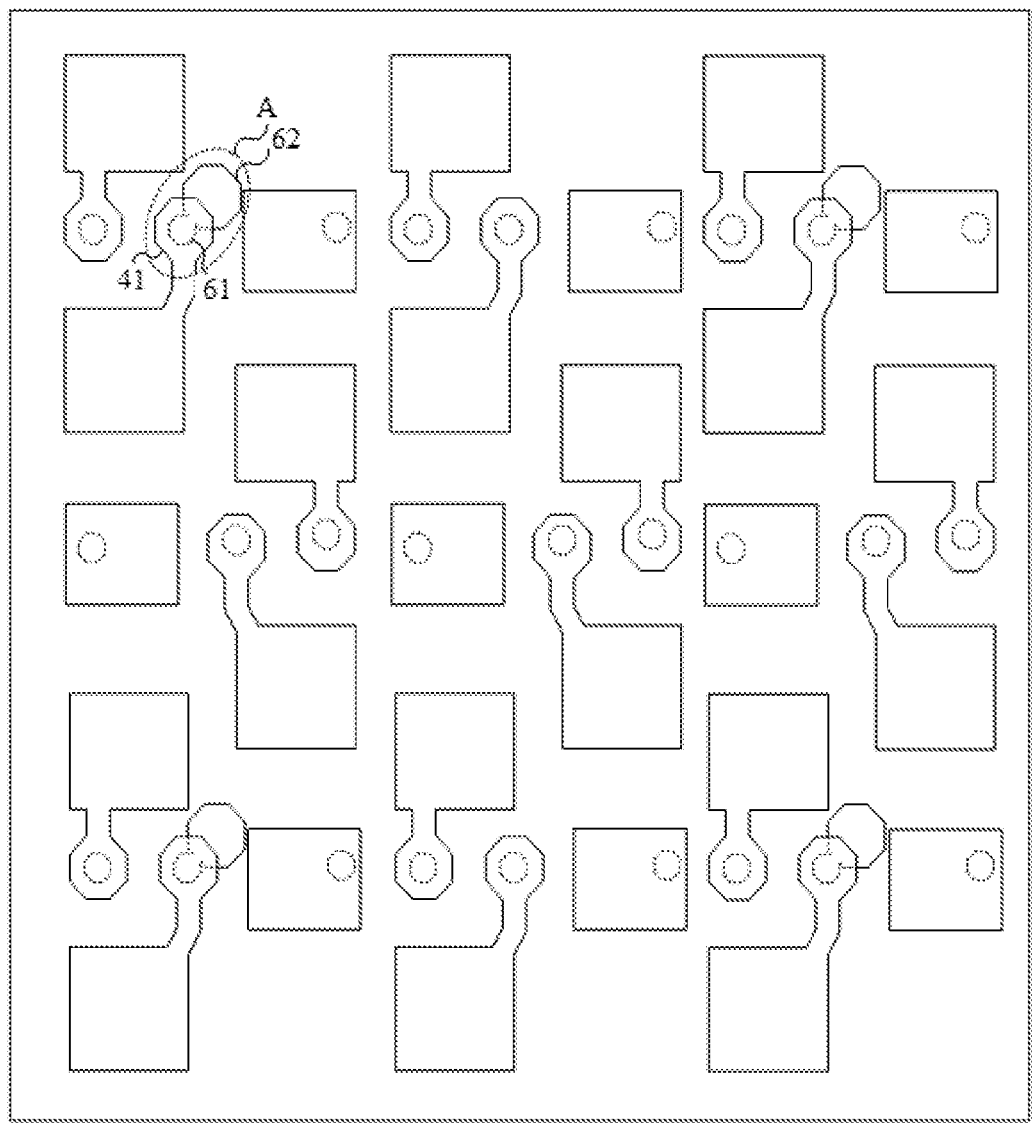
FIG. 4 is a structural diagram of a display panel according to an embodiment of the present disclosure.
Figure 5:
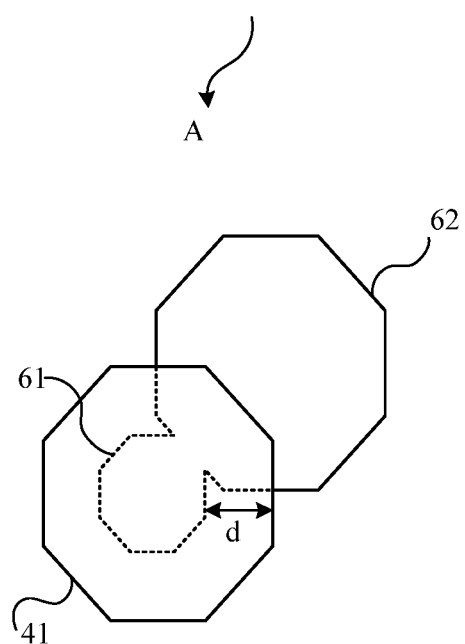
FIG. 5 is an enlarged view of an area A in FIG. 4.

The inventor has found that since both the imaging aperture 62 and the via hole 61 are disposed on the light-blocking layer 30, the imaging aperture 62 and the via hole 61 may be formed through one punching, thereby simplifying the preparation of the imaging aperture 62 and the via hole 61. Thus, the inventor has provided a design for forming the imaging aperture 62 and the via hole 61 through one punching, as shown in FIG. 4. FIG. 5 is an enlarged view of an area A in FIG. 4. In order to simplify the preparation of the via hole 61 and the imaging aperture 62, the via hole 61 and the imaging aperture 62 are formed through one punching, that is, the via hole 61 is in communication with the imaging aperture 62. However, when the distance d between the edge of the anode 41 and the edge of the via hole 61 is large, most of the light reflected to the imaging aperture 62 is blocked by the anode 41, affecting the amount of light signals arriving in the fingerprint recognition unit 50 through the imaging aperture 62, and affecting the sensitivity of fingerprint recognition.

Based on the above technical problems, the inventor has further developed a display panel provided in an embodiment of the present disclosure. The display panel includes a base substrate, a plurality of drive circuits, a light-blocking layer, and a plurality of organic light-emitting units, where the base substrate, the plurality of drive circuits, the light-blocking layer, and the plurality of organic light-emitting units are successively stacked. The display panel further includes a plurality of fingerprint recognition units located on a side of the light-blocking layer facing away from the organic light-emitting units. A plurality of via holes and a plurality of imaging apertures are formed in the light-blocking layer. The via holes include first via holes and second via holes, and each of the first via holes is in communication with one of the imaging apertures. Light reflected by a touch body is incident to one of the fingerprint recognition units through the one of the imaging apertures. The organic light-emitting units include first organic light-emitting units and second organic light-emitting units, each of the first organic light-emitting units includes a first anode, and each of the second organic light-emitting units includes a second anode. The first anode is electrically connected to one of the drive circuits through one of the first via holes, and the second anode is electrically connected to one of the drive circuits through one of the second via holes. In a first direction, a distance between an edge on a side of the first anode facing close to one of the imaging apertures and a center of one of the first via holes is L1, a distance between an edge of the second anode and a center of one of the second via holes is L2, and L1<L2. The first direction is parallel to a direction of a connection line between the center of one of the first via holes points and the center of one of the imaging apertures. By using the above technical solution, in a direction parallel to the direction of the connection line between the center of one of the first via holes and the center of one of the imaging apertures, the distance L1 between the edge on a side of the first anode facing close to the imaging aperture and the center of the first via hole and the distance L2 between an edge of the second anode and the center of the second via hole are set to satisfy that L1<L2, ensuring that the distance between the edge on a side of the first anode facing close to the imaging aperture and the center of the first via hole is small, reducing the part of the imaging aperture blocked by the first anode, ensuring that the imaging aperture has a large light transmission region so that more of the light reflected by the finger is incident to the fingerprint recognition unit through the imaging aperture, increasing the amount of optical signals received by the fingerprint recognition unit, and improving the sensitivity of fingerprint recognition by the fingerprint recognition unit.

The above is a core idea of the present disclosure. Technical solutions in the embodiments of the present disclosure will be described clearly and completely in conjunction with drawings in the embodiments of the present disclosure. Based on the embodiments of the present disclosure, all other embodiments obtained by those skilled in the art without making creative work are within the scope of the embodiments of the present disclosure.

Figure 6:
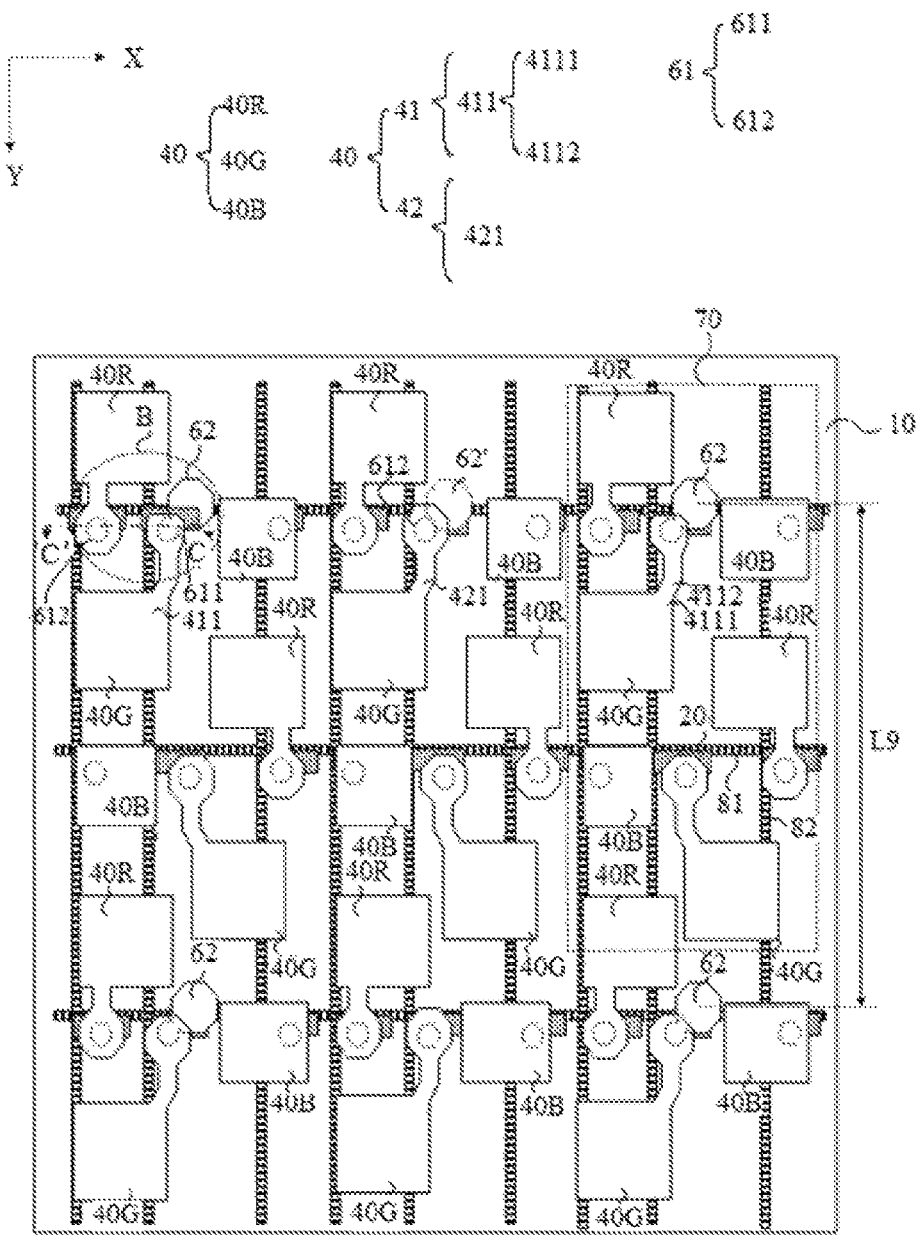
FIG. 6 is a structural diagram of another display panel according to an embodiment of the present disclosure.
Figure 7:
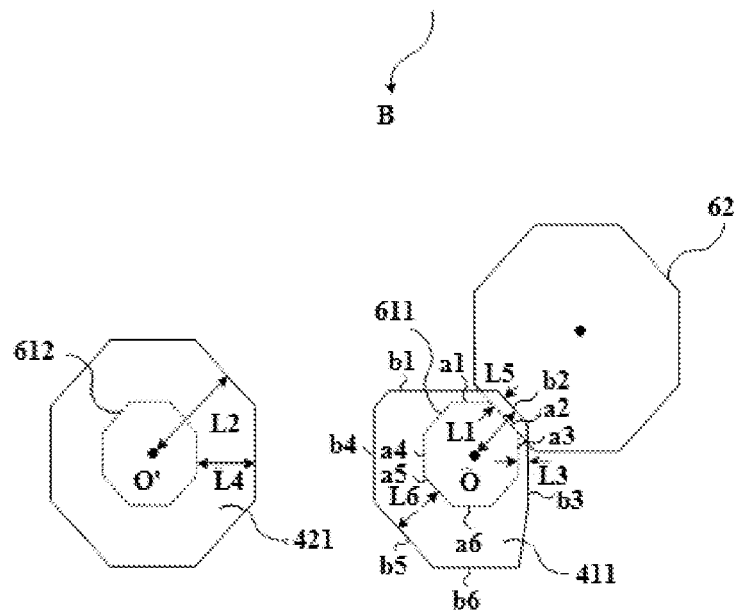
FIG. 7 is an enlarged view of an area B in FIG. 6.
Figure 8:
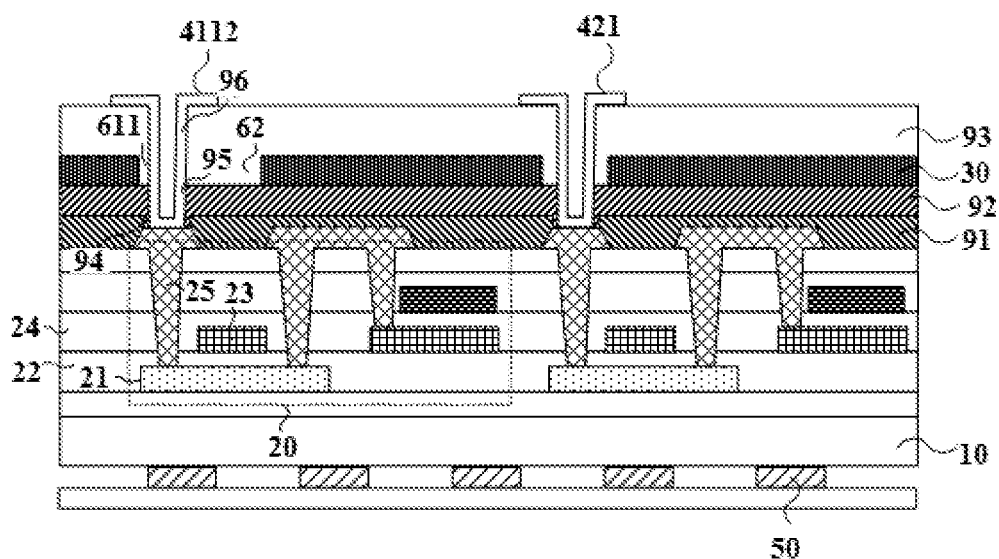
FIG. 8 is a section view of the display panel illustrated in FIG. 6 along a section line C-C'.
Figure 9:
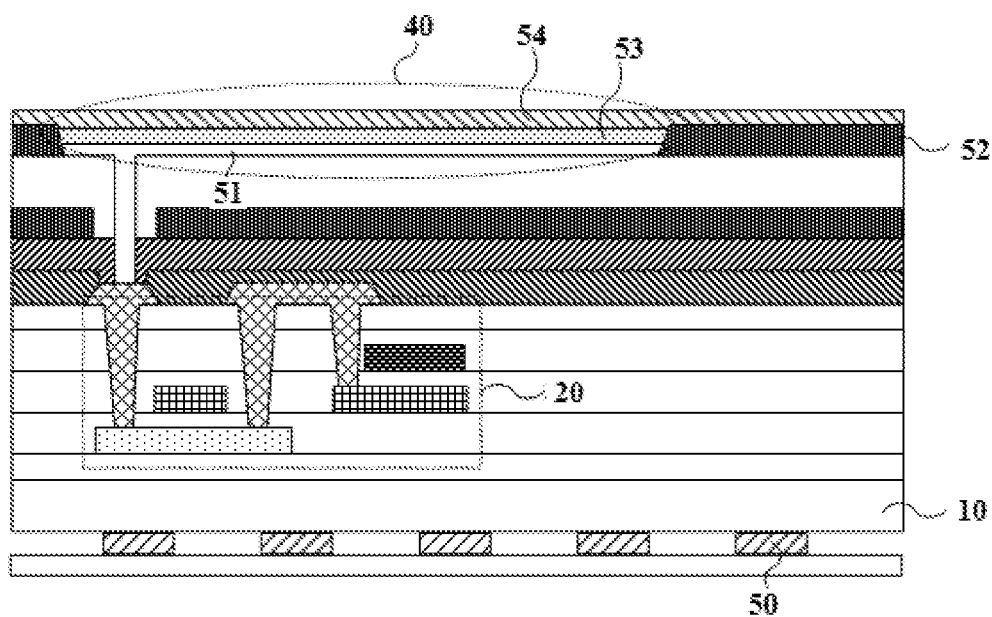
FIG. 9 is another section view of the display panel illustrated in FIG. 6.

FIG. 6 is a structural diagram of a display panel according to an embodiment of the present disclosure. FIG. 7 is an enlarged view of an area B in FIG. 6. FIG. 8 is a section view of the display panel illustrated in FIG. 6 along a section line C-C'. FIG. 9 is another section view of the display panel illustrated in FIG. 6. As shown in FIG. 6, FIG. 7, FIG. 8, and FIG. 9, the display panel provided in the embodiment of the present disclosure may include a base substrate 10, a plurality of drive circuits 20, a light-blocking layer 30, a plurality of organic light-emitting units 40, and a plurality of fingerprint recognition units 50. The base substrate, the plurality of drive circuits, the light-blocking layer, and the plurality of organic light-emitting units are successively stacked, and the plurality of fingerprint recognition units 50 are located on a side of the light-blocking layer 30 facing away from the organic light-emitting units 40. A plurality of via holes 61 and a plurality of imaging apertures 62 are formed in the light-blocking layer 30. The via holes 61 include first via holes 611 and second via holes 612, and each of the first via holes 611 is in communication with an imaging aperture 62 to form a large hollow region. Light reflected by a touch body is incident to the fingerprint recognition unit 50 through the imaging aperture 62.

The organic light-emitting units 40 include first organic light-emitting units 41 and second organic light-emitting units 42. Each of the first organic light-emitting units 41 includes a first anode 411, and each of the second organic light-emitting units 42 includes a second anode 421. The first anode 411 is electrically connected to one of the drive circuit 20 through the first via hole 600, and the second anode 421 is electrically connected to one of the drive circuits 20 through the second via hole 612.

In a first direction, a distance between an edge on a side of the first anode 411 close to the imaging aperture 62 and a center O of the first via hole 611 is L1, a distance between an edge of the second anode 421 and a center O' of the second via hole 612 is L2, and L1<L2. The first direction is parallel to a direction of a connection line between the center of the first via hole 611 and the center of the imaging aperture 62.

Optionally, the base substrate 10 may be a rigid substrate or a flexible substrate, and the material of the substrate 10 is not limited in the embodiments of the present disclosure. Each drive circuit 20 may include an active layer 21, a gate insulation layer 22, a gate layer 23, an interlayer insulation layer 24, and a source/drain layer 25 which are successively located on a side of the base substrate 10. The gate layer 23 may form a gate, a scan line, and the first electrode of a storage capacitor in the drive circuit 20. The source/drain layer 25 may form a source, a drain, a data line, and a power source signal line in the drive circuit 20. The materials of the gate insulation layer 22 and the interlayer insulation layer 24 may include an oxide of silicon or a nitride of silicon, which is not limited in the embodiments of the present disclosure. The drive circuit 20 may further include an intermediate insulation layer and an intermediate metal layer that are stacked between the gate layer 23 and the interlayer insulation layer 24 in a direction facing away from the base substrate 10. The intermediate metal layer is generally used to form a second electrode of the storage capacitor and a reference voltage line. Each organic light-emitting unit 40 may include an anode 51, a pixel definition layer 52, an organic light-emitting layer 53, and a cathode layer 54. The pixel definition layer 52 includes a pixel definition layer opening that is in one-to-one correspondence with the anode 51 and exposes the body of the anode. The display panel may further include an encapsulation layer (not shown in the figure) located on a side of the organic light-emitting units 40 facing away from the base substrate 10 and used for water and oxygen protection of the organic light-emitting units 40.

Further, in order to simplify the preparation of the via hole 61 and the imaging aperture 62, the via hole 61 and the imaging aperture 62 are formed through one punching, that is, the via hole 61 is in communication with the imaging aperture 62. At the same time, the inventor found, through studies, that when the distance d between the edge of the anode 51 and the edge of the via hole 61 is large, most of the light reflected to the imaging aperture 62 is blocked by the anode 51, affecting the amount of light signals arriving in the fingerprint recognition unit 50 through the imaging aperture 62, and affecting the sensitivity of the fingerprint recognition. The number of via holes 61 is larger than the number of imaging aperture 62. Therefore, in order to simplify the preparation process of the via hole 61 and the imaging aperture 62, the first via hole 611 and the imaging aperture 62 are formed in the same process, and the first via hole 611 is communication with the imaging aperture 62. In order to reduce the light reflected to the imaging aperture 62 and blocked by the first anode 411, in a direction parallel to the direction of the connection line between the center of the first via hole 611 and the center of the imaging aperture 62, the distance between an edge on a side of the first anode 411 close to the imaging aperture 62 and the center O of the first via hole 611 is L1, the distance between an edge of the second anode 421 and a center O' of the second via hole 612 is L2, and L1<L2. Then, the distance L1 between an edge on a side of the first anode 411 facing close to the imaging aperture 62 and the center O of the first via hole 611 is small, thereby reducing the part of the the imaging aperture 62 blocked by the first anode 411, ensuring that the imaging aperture 62 has a large light transmission region so that more of the light reflected by the finger is incident to the fingerprint recognition unit 50 through the imaging aperture 62, increasing the amount of optical signals received by the fingerprint recognition unit 50, and improving the sensitivity of fingerprint recognition of the fingerprint recognition unit 50.

In other words, a distance between an edge of the first via hole at least partially covered by the first anode and an edge of the first anode is a first distance; a distance between an edge of the second via hole at least partially covered by the second anode and an edge of the second anode is a second distance; and the first distance is less than the second distance.

It should be noted that the embodiment of the present disclosure does not limit the relative position relationship between the first anode 411 and the first via hole 611 as well as the relative position relationship between the second anode 421 and the second via hole 612. When the vertical projection of the first anode 411 on the base substrate 10 completely covers the vertical projection of the first via hole 611 on the base substrate 10 and the vertical projection of the second anode 421 on the base substrate 10 completely covers the vertical projection of the second via hole 612 on the base substrate 10, the distance L1 between an edge on a side of the first anode 411 facing close to the imaging aperture 62 and a center O of the first via hole 611 and the distance L2 between an edge of the second anode 421 and the center O' of the second via hole 612 are set so that L1 is less than L2. In this way, the area of the part of the imaging aperture 62 covered by the first anode 411 is small, and the light transmitted through the imaging aperture 62 is large. The sensitivity of fingerprint recognition is improved. When the vertical projection of the first anode 411 on the base substrate 10 partially covers the vertical projection of the first via hole 611 on the base substrate 10 and the vertical projection of the second anode 421 on the base substrate 10 partially covers the vertical projection of the second via hole 612 on the base substrate 10, for example, when the edge on a side of the first anode 411 facing close to the imaging aperture 62 is located on a side of the center O of the first via hole 611 facing away from the imaging aperture 62 and the second anode 421 covers a small part of the second via hole 612 and does not cover the center O' of the second via hole 612, the distance L1 between the edge on a side of the first anode 411 facing close to the imaging aperture 62 and the center O of the first via hole 611 and the distance L2 between the edge of the second anode 421 and the center O' of the second via hole 612 are set so that L1 is less than L2, thereby reducing the amount of light leaked from the first via hole 611.

It may be understood that, in the embodiment of the present disclosure, the first via hole 611 and the second via hole 612 may have the same shape, so that the shape of the first via hole 611 may be determined according to the shape of the second via hole 612, and a boundary between the first via hole 611 and the imaging aperture 62 is thereby determined. The center of the first via hole 611 may be determined according to the boundary of the first via hole 611, and the center of the second via hole 612 may be determined according to the shape of the second via hole 612. In the embodiment, the center O of the first via hole 611 may be understood as the geometric center of the first via hole 611; the center O' of the second via hole 612 may be understood as the geometric center of the second via hole 612; and the distance between two may be a distance between projections of the two on the base substrate.

Optionally, the imaging aperture 62 is an octagon, and the via hole 61 is also an octagon. Further, the boundary between the imaging aperture 62 and the first via hole 611 or the position at which the imaging aperture 62 and the first via hole 611 are connected to each other is at least one side of the respective octagon described above. Further, the anode 51 covers corresponding via hole 61. Optionally, the edges of the part of the first anode 411 covering the first via hole 611 are parallel to the edges of the first via hole 611. Specifically, the first via hole 611 in the shape of an octagon includes eight non-collinear edges, and at least three sides of the octagon are separately parallel to the edges of the first anode 411 covering the first via hole 611. This may make the edge of the first anode 411 to be kept at a uniform distance from the edge of the first via hole 611. Furthermore, the pattern imaging is easily controlled, and the process difficulty is not increased, so that the accuracy of the patterning is improved, and the influence of the first anode 411 on the imaging aperture 62 is accurately controlled. The first via hole 611 may also be uniformly blocked by the first anode 411 at the boundary between the first via hole 611 and the imaging aperture 62.

Specifically, in the first direction, the distance between an edge on a side of the first anode 411 facing close to the imaging aperture 62 and a center O of the first via hole 611 is L1, the distance between an edge of the second anode 421 and a center O' of the second via hole 612 is L2, and L1<L2, which may be that the vertical projection of the first anode 411 on the base substrate 10 completely covers the vertical projection of the first via hole 611 on the base substrate 10, and may also be that the vertical projection of the first anode 411 on the base substrate 10 partially covers the vertical projection of the first via hole 611 on the base substrate 10. At the same time, the technical solution in which the vertical projection of the first anode 411 on the base substrate 10 completely covers the vertical projection of the first via hole 611 on the base substrate 10 may be implemented in multiple manners; and the technical solution in which the vertical projection of the first anode 411 on the base substrate 10 partially covers the vertical projection of the first via hole 611 on the base substrate 10 may also be implemented in multiple manners, which will be described below in detail.

The solution in which the vertical projection of the first anode 411 on the base substrate 10 completely covers the vertical projection of the first via hole 611 on the base substrate 10 is first taken as an example for description.

Further referring to FIG. 7, the vertical projection of the first anode 411 on the base substrate 10 completely covers the vertical projection of the first via hole 611 on the base substrate 10, and the vertical projection of the second anode 421 on the base substrate 10 completely covers the vertical projection of the second via hole 612 on the base substrate 10. The minimum distance between an edge of the first via hole 611 and an edge of the first anode 411 is L3, the minimum distance between an edge of the second via hole 612 and an edge of the second anode 421 is L4, and L3<L4.

Exemplarily, the vertical projection of the first anode 411 on the base substrate 10 completely covers the vertical projection of the first via hole 611 on the base substrate 10, and the vertical projection of the second anode 421 on the base substrate 10 completely covers the vertical projection of the second via hole 612 on the base substrate 10. Then, the first via hole 611 is well covered by the first anode 411 and the second via hole 612 is well covered by the second anode 421, thus leakage of light from the first via hole 611 and the second via hole 612 may be avoided, and impact on fingerprint recognition accuracy due to leakage light may be avoided. The minimum distance between an edge of the first via hole 611 and an edge of the first anode 411 may be understood as the minimum distance between an edge on a side of the first anode 411 facing close to the imaging aperture 62 and a corresponding edge of the first via hole 611. The minimum distance L3 between an edge of the first via hole 611 and an edge of the first anode 411 and the minimum distance L4 between an edge of the second via hole 612 and the edge of the second anode 421 are set so that L3 is less than L4, thereby ensuring that less of the imaging aperture 62 is blocked by the side of the first anode 411 facing close to the imaging aperture 62. Therefore, the imaging aperture 62 has a large light transmission region so that more of the light reflected by the finger is incident to the fingerprint recognition unit 50 through the imaging aperture 62, increasing the amount of optical signals received by the fingerprint recognition unit 50, and improving the sensitivity of fingerprint recognition of the fingerprint recognition unit 50.

Further, $0 \leq L3 \leq 2$ μm and $3 \leq L4 \leq 5$ μm. The minimum distance between an edge of the first via hole 611 and an edge of the first anode 411 as well as the minimum distance between an edge of the second via hole 612 and an edge of the second anode 421 are suitably set so that more of the light reflected by the finger is incident to the fingerprint recognition unit 50 through the imaging aperture 62, and the sensitivity of fingerprint recognition of the fingerprint recognition unit 50 is improved. Meanwhile, the first via hole 611 is well covered by the first anode 411 and the second via hole 612 is well covered by the second anode 421, thereby avoiding impact on the fingerprint recognition accuracy due to leakage of light from the first via hole 611 and the second via hole 612.

Further referring to FIG. 7, a distance between an edge on a side of the first via hole 611 facing close to the imaging aperture 62 and the edge on the side of the first anode 411 facing close to the imaging aperture 62 is L5, a distance between an edge on a side of the first via hole 611 facing away from the imaging aperture 62 and an edge on a side of the first anode 411 facing away from the imaging aperture is L6, and L5 is less than L6.

Exemplarily, by setting L5 to be less than L6, on one hand, the part of the imaging aperture 62 blocked by the first anode 411 may be reduced, and on the other hand, on the side of the first via hole 611 facing away from the imaging aperture 62, the first via hole 611 is well covered by the first anode 411, thereby reducing the leakage light from the first via hole 611. At the same time, the influence on the contact performance and the electrical performance due to the reduction in an area of a region of the via hole covered by corresponding first anode 411 is avoided.

It should be noted that the distance L5 between an edge on a side of the first via hole 611 facing close to the imaging aperture 62 and the edge on the side of the first anode 411 facing close to the imaging aperture 62 is the same as the minimum distance L3 between an edge of the first via hole 611 and an edge of the first anode 411.

Optionally, the imaging aperture 62 is an octagon, and the via hole 61 is also an octagon.

Further, the boundary between the imaging aperture 62 and the first via hole 611 or the position at which the imaging aperture 62 and the first via hole 611 are connected to each other is at least one side of the respective octagon described above.

Further, the anode 51 covers corresponding via hole 61. Optionally, some edges of the first anode 411 covering the first via hole 622 are parallel to the edges of the first via hole 611. Specifically, the first via hole 611 in the shape of an octagon includes eight non-collinear edges, and at least three sides of the octagon are separately parallel to the edges of the anode covering the via hole.

Optionally, the anode 51 completely covers the via hole 62 to ensure the performance of connection between the anode 51 and the drive circuit 20, and in particular, to avoid consistency of a degree of connection between the first anode 411 and the drive circuit 20 and a degree of connection between the second anode 421 and the drive circuit 20 (here, the degree of connection may be understood as the contact area of the anode 51 and the source/drain of the thin-film transistor in the drive circuit 20).

Through the above design, the edge of the first anode 411 may be kept at a uniform distance from the edge of the first via hole 611. Furthermore, the pattern imaging is easily controlled, and the process difficulty is not increased, so that the accuracy of the patterning is improved, and the influence of the anode on the imaging aperture is accurately controlled. The blocking, by the anode, at the boundary between the first via hole 611 and the imaging aperture 62 may also be uniform.

Further, for the first via hole 611 in the shape of an octagon, the first side a1, the second side a2, and the third side a3 of the first via hole 611 may be disposed at the same distance, e.g., L3, respectively from the first side b1, the second side b2, and the third side b3 of the first anode 411. Meanwhile, the fourth side a4, the fifth side a5, and the sixth side a6 of the first via hole 611 are disposed at the same distance, e.g., L6, respectively from the fourth side b4, the fifth side b5, and the sixth side b6 of the first anode 411. Through the design of the imaging aperture 62, the first anode 411, and the first via hole 611 provided above, the first anode 411 is configured to cover less part of the imaging aperture 62 as much as possible and cover the first via hole 611 completely.

Of course, in other optional embodiments of the present application, L6 is set to be greater than L4, where L6 is the distance between an edge on a side of the first via hole 611 facing away from the imaging aperture 62 and an edge on a side of the first anode 411 facing away from the imaging aperture, L4 is the minimum distance between an edge of the second via hole 612 and an edge of the second anode 421. In this way, it is ensured that the first anode 411 has a good light blocking effect on the first via hole 611 on a side facing away from the imaging aperture 62. At the same time, it is ensured that the area of the first anode 411 is the same as or approximate to the area of the second anode 421, and that the degree of connection between the first anode 411 and the drive circuit 20 is consistent with the degree of connection between the second anode 421 and the drive circuit 20. Moreover, it may be avoided that the first anode is different from the second anode in the electrical performance due to missing of an anode connection portion caused by keeping the first anode away from the imaging aperture. An increase in fabrication precision and an increase in cost caused by a decrease in the area of the first anode where the first via hole is arranged may also be avoided.

Figure 10:
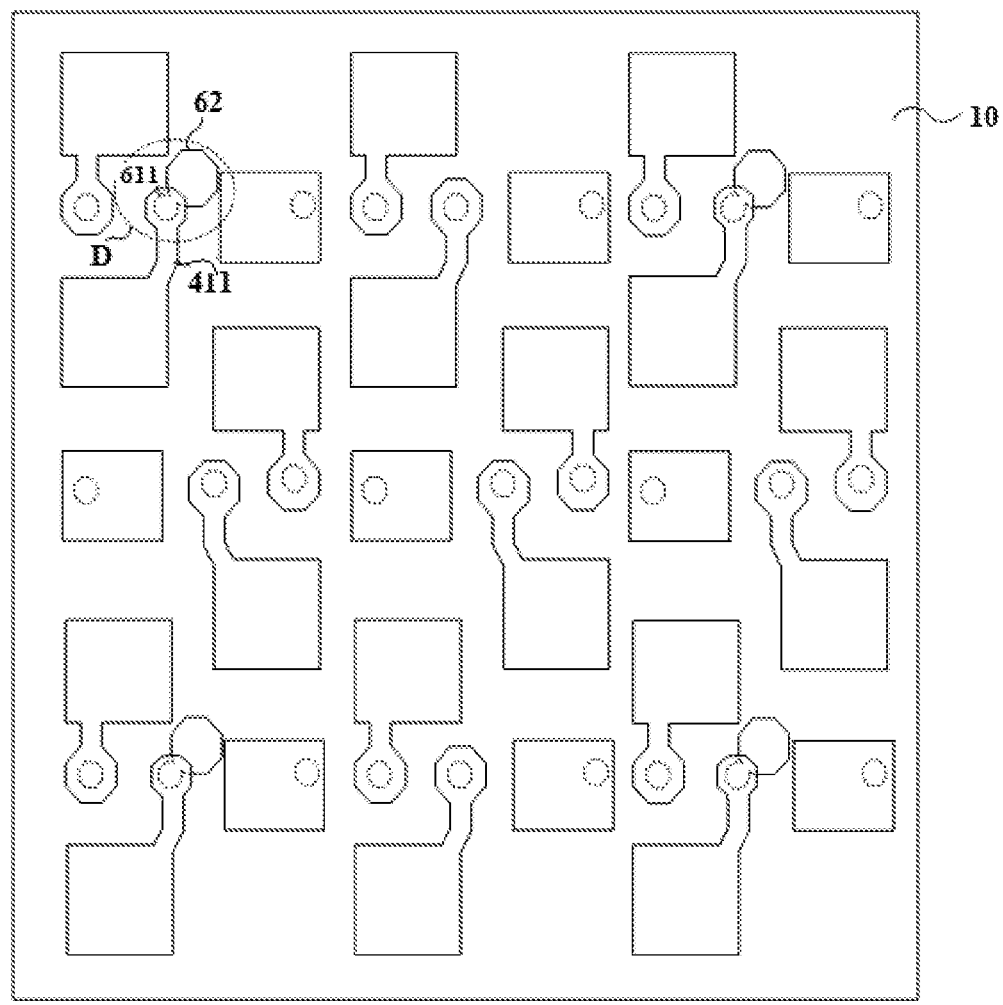
FIG. 10 is a structural diagram of another display panel according to an embodiment of the present disclosure.
Figure 11:
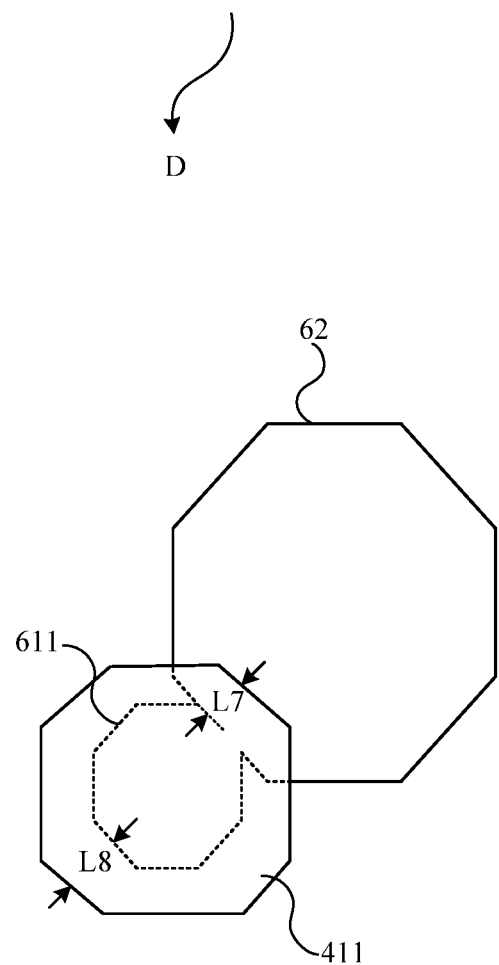
FIG. 11 is an enlarged view of an area D in FIG. 10.

FIG. 10 is a structural diagram of another display panel according to an embodiment of the present disclosure. FIG. 11 is an enlarged view of an area D in FIG. 10. As shown in FIGS. 10 and 11, a distance between an edge on a side of the first via hole 611 facing close to the imaging aperture 62 and the edge on the side of the first anode 411 facing close to the imaging aperture 62 is L7, a distance between an edge on a side of the first via hole 611 facing away from the imaging aperture 62 and an edge on a side of the first anode 411 facing away from the imaging aperture 62 is L8, and L7 is equal to L8.

Exemplarily, L7 is set to be equal to L8 so that the first via hole 611 is uniformly covered by the first anode 411 and serious leakage of the light in partial region of the first via hole 611 is avoided.

As described above, the first anode 411 and the first via hole 611 are configured so that the vertical projection of the first via hole 611 on the base substrate 10 is completely within the vertical projection of the first anode 411 on the base substrate 10. With such configuration, no matter the distance between an edge on a side of the first via hole 611 facing close to the imaging aperture 62 and the edge on the side of the first anode 411 facing close to the imaging aperture 62 is less than or equal to the distance between an edge on a side of the first via hole 611 facing away from the imaging aperture 62 and an edge on a side of the first anode 411 facing away from the imaging aperture, i.e., no matter L5<L6 or L7=L8, the imaging aperture 62 may be less covered by the first anode 411 and the first via hole 611 may be sufficiently covered by the first anode 411. Therefore, light is avoided from leaking from the first via hole 611. The sensitivity of fingerprint recognition can be ensured to be high, the accuracy of fingerprint recognition can also be ensured, and a good fingerprint recognition effect is ensured.

Next, the solution in which the vertical projection of the first via hole 611 on the base substrate 10 is partially within the vertical projection of the first anode 411 on the base substrate 10 is taken as an example for description.

Figure 12:
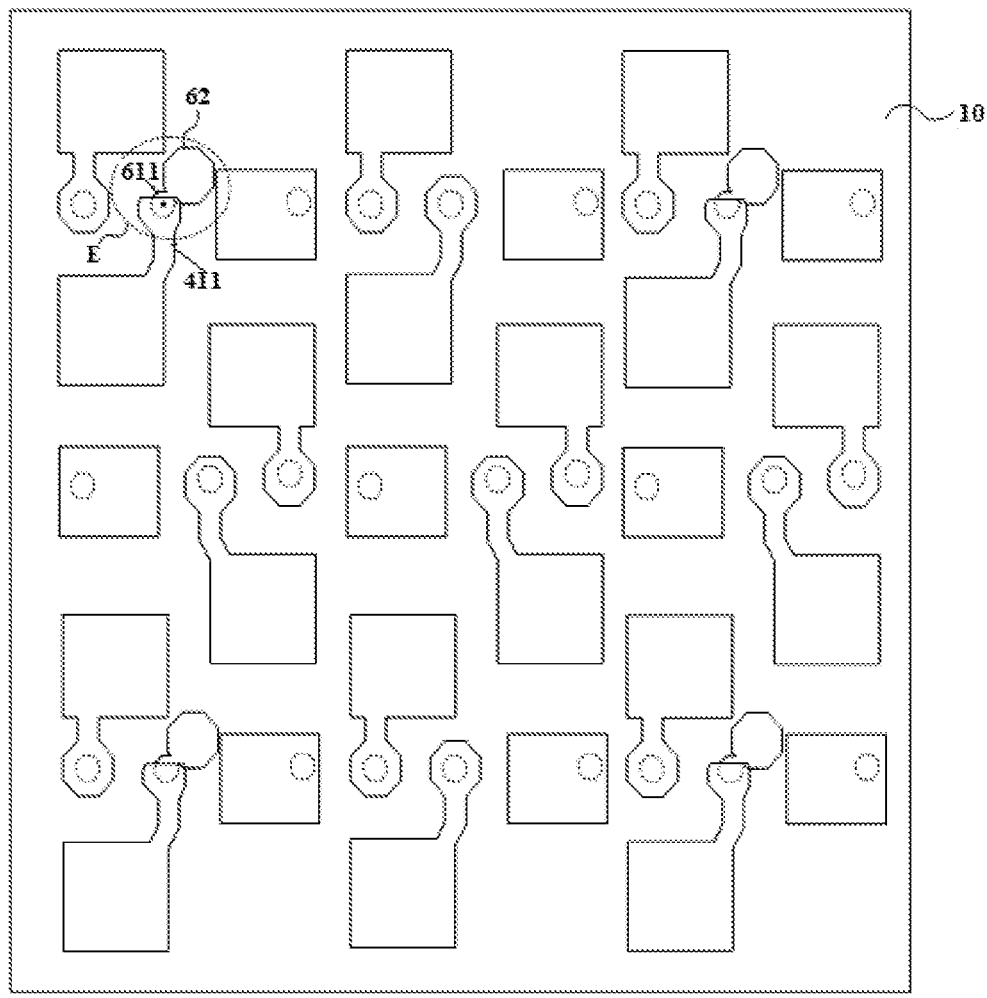
FIG. 12 is a structural diagram of another display panel according to an embodiment of the present disclosure.
Figure 13:
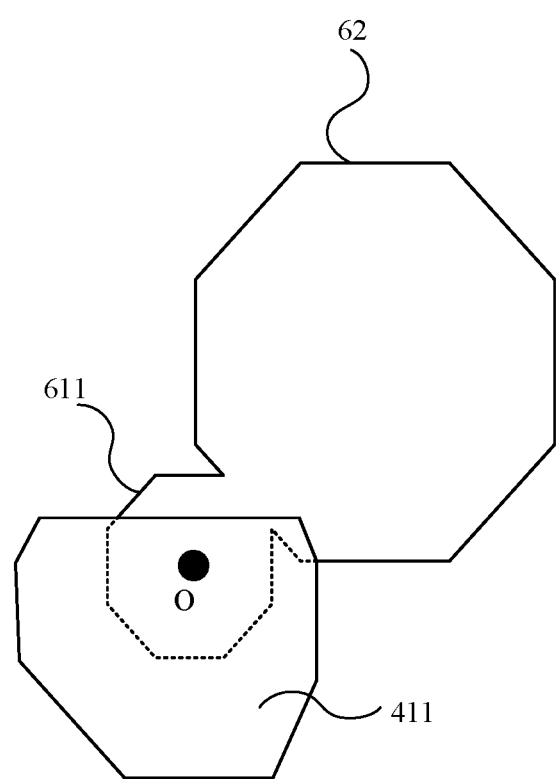
FIG. 13 is an enlarged view of an area E in FIG. 12.
Figure 14:
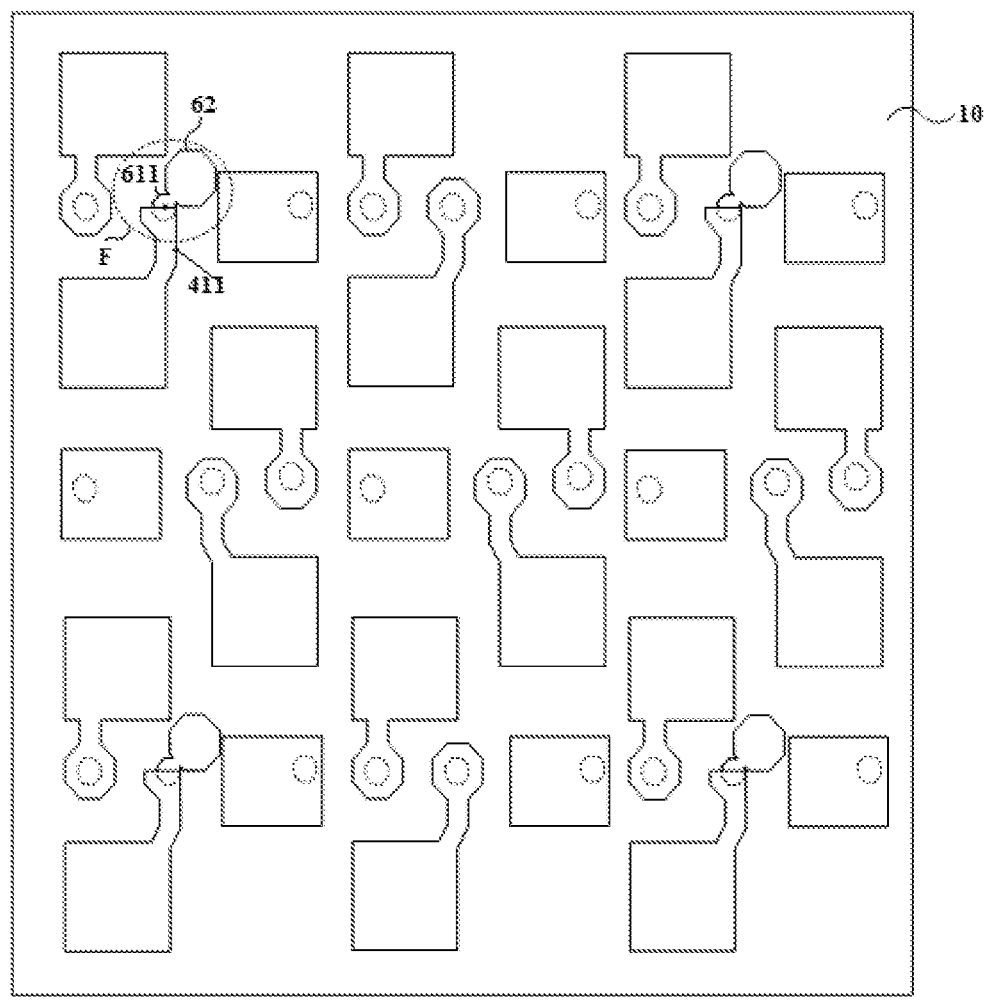
FIG. 14 is a structural diagram of another display panel according to an embodiment of the present disclosure.
Figure 15:
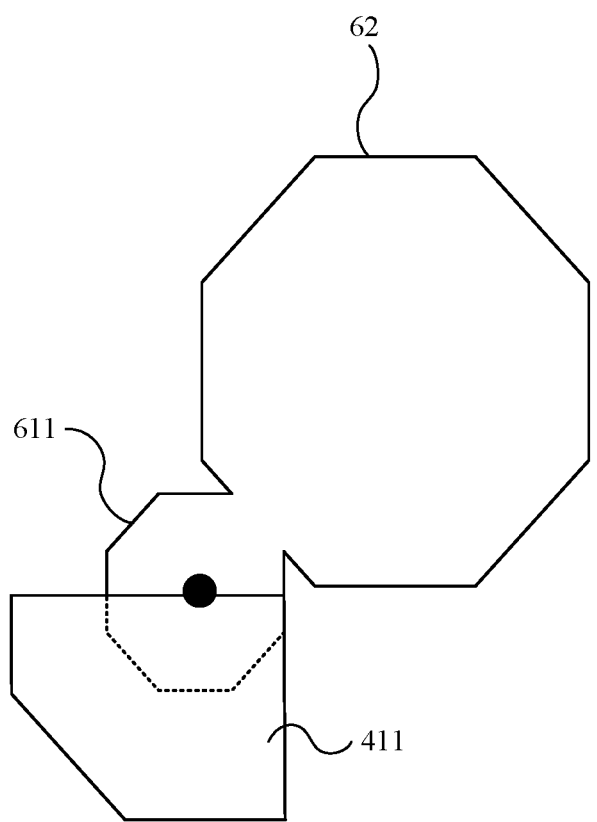
FIG. 15 is an enlarged view of an area F in FIG. 14.
Figure 16:
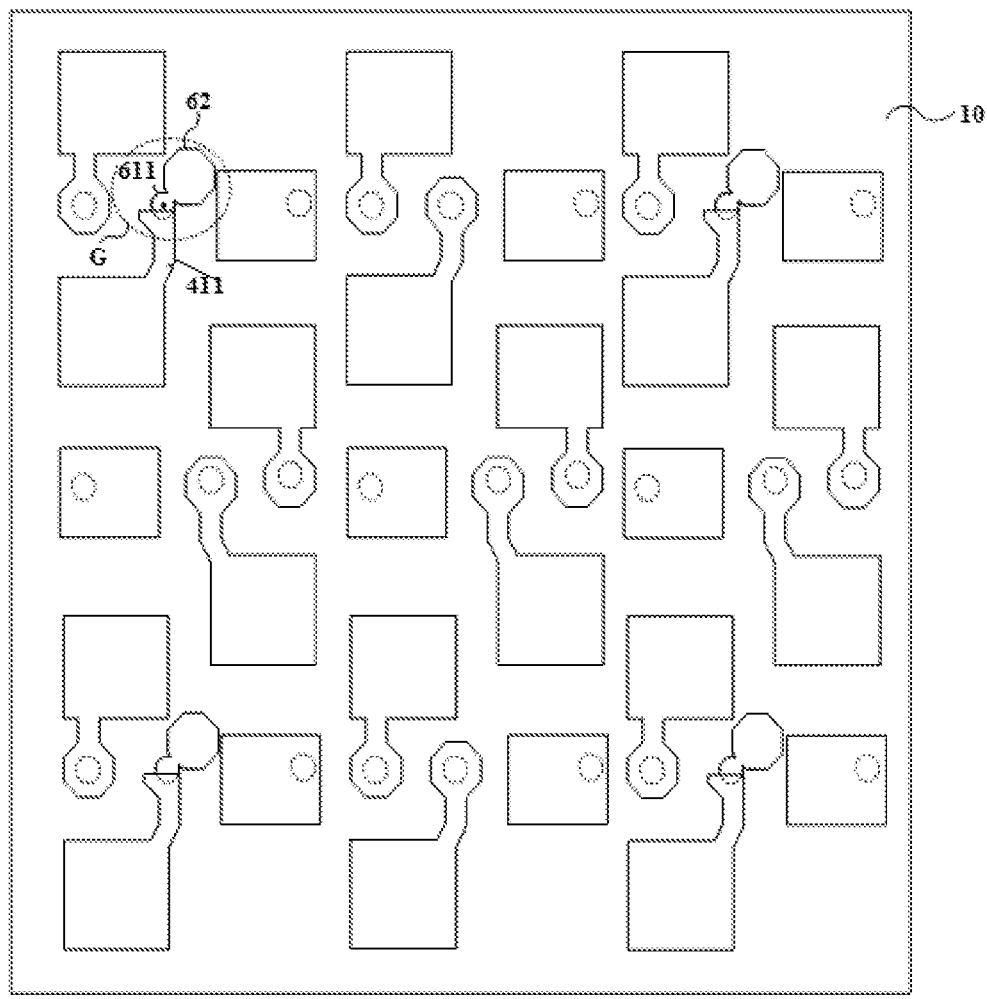
FIG. 16 is a structural diagram of another display panel according to an embodiment of the present disclosure.
Figure 17:
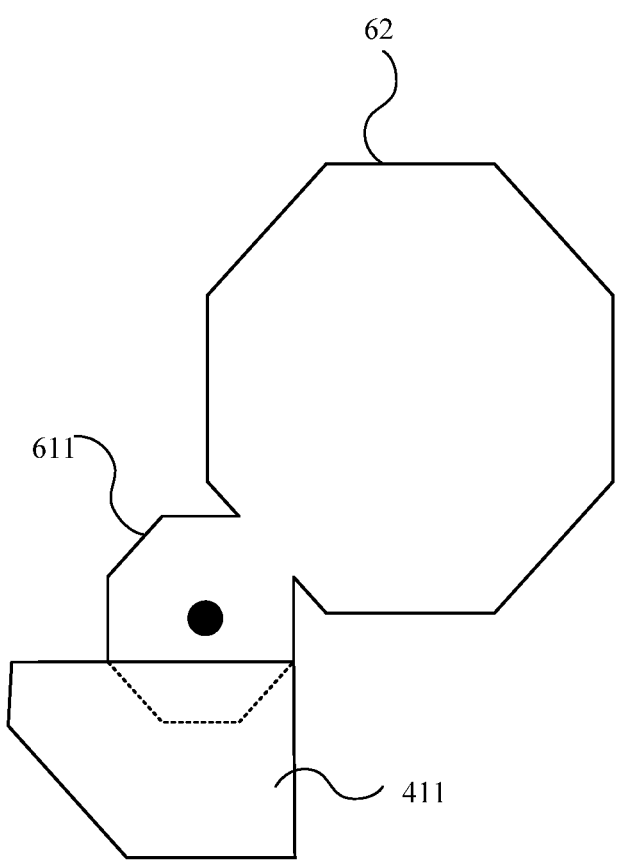
FIG. 17 is an enlarged view of an area G in FIG. 16.

The vertical projection of the first via hole 611 on the base substrate 10 is partially within the vertical projection of the first anode 411 on the base substrate 10, and an edge on a side of the first anode 411 facing close to the imaging aperture 62 is located on a side of the center O of the first via hole 611 facing close to the imaging aperture 62, as shown in FIGS. 12 and 13. Optionally, the edge on a side of the first anode 411 facing close to the imaging aperture 62 passes through the center O of the first via hole 611, as shown in FIGS. 14 and 15. Optionally, the edge on a side of the first anode 411 facing close to the imaging aperture 62 is located on a side of the center O of the first via hole 611 facing away from the imaging aperture 62, as shown in FIGS. 16 and 17.

Exemplarily, for the case in which the vertical projection of the first via hole 611 on the base substrate 10 is partially within the vertical projection of the first anode 411 on the base substrate 10, the relative position relationship between an edge on a side of the first anode 411 facing close to the imaging aperture 62 and the center O of the first via hole 611 is not limited in the embodiment of the present disclosure, as long as the vertical projection of the first anode 411 on the base substrate 10 and the vertical projection of the first via hole 611 on the base substrate 10 are overlapped to ensure that the first anode 411 is electrically connected to the drive circuit 20 through the first via hole 611. Specifically, the edge on a side of the first anode 411 facing close to the imaging aperture 62 may be located on the side of the center O of the first via hole 611 facing close to the imaging aperture 62, as shown in FIGS. 12 and 13. The edge on a side of the first anode 411 facing close to the imaging aperture 62 may also pass through the center O of the first via hole 611, as shown in FIGS. 14 and 15. The edge on a side of the first anode 411 facing close to the imaging aperture 62 may also be located on the side of the center O of the first via hole 611 facing away from the imaging aperture 62, as shown in FIGS. 16 and 17.

It should be noted that when the vertical projection of the first via hole 611 on the base substrate 10 is partially within the vertical projection of the first anode 411 on the base substrate 10, light may leak from the part of the first via hole 611 that is not covered by the first anode 411. However, since the number N1 of the first organic light-emitting units 41 and the number N2 of the second organic light-emitting units 42 satisfy that N1/N2<1:99, that is, the ratio of the number of the first organic light-emitting units 41 to the total of the organic light-emitting units is extremely small, less than 1%, the light leaked from the first via hole 611 can be ignored even if the light leaked increases due to a decrease in the coverage area of the first anode 411. Further, the light leaked has little impact on the accuracy of fingerprint recognition.

Optionally, further referring to FIG. 6, the organic light-emitting unit 40 may include a red organic light-emitting unit 40R, a green organic light-emitting unit 40G, and a blue organic light-emitting unit 40B. The first organic light-emitting unit 41 may be the red organic light-emitting unit 40R, the green organic light-emitting unit 40G or the blue organic light-emitting unit 40B.

Exemplarily, the first organic light-emitting unit 41 may be an organic light-emitting unit of the same color, ensuring that the imaging environment around the imaging aperture 62 in the display panel is the same. The organic light-emitting unit 40 has the same effect on the imaging apertures 62 at different positions, ensuring uniform imaging through the imaging apertures 62 and high accuracy of fingerprint recognition.

Further referring to FIG. 6, the first anode 411 may include an electrode portion 4111 located in an opening region of a pixel defining layer (not shown in the figure) and a connection portion 4112 connected to the electrode portion 4111. A vertical projection of the connection portion 4112 and a vertical projection of the first via hole 611 on the base substrate 10 overlap, and the electrode portion 4111 is electrically connected to the drive circuit 20 through the connection portion 4112 and the first via hole 611. The size of the connection portion 4112 of the first anode 411 corresponding to the imaging aperture 62 is large, ensuring that a distance between the imaging aperture 62 and the electrode portion 4111 is long, preventing light emitted from a region corresponding to the electrode portion 4111 from directly entering the fingerprint recognition unit 50, and ensuring that the accuracy of fingerprint recognition is high.

Optionally, the first organic light-emitting unit 41 may be a green organic light-emitting unit 40G, as shown in FIG. 6, or may be a red organic light-emitting unit 40R or a blue organic light-emitting unit 40B, which is not limited in the embodiment of the present disclosure.

Further referring to FIG. 6, an organic light-emitting unit group 70 is formed by a plurality of red organic light-emitting units 40R, a plurality of green organic light-emitting units 40G, and a plurality of blue organic light-emitting units 40B. A plurality of imaging apertures 62 are arranged in an array, and at least one organic light-emitting unit group 70 is arranged between two adjacent imaging apertures 62.

Exemplarily, the organic light-emitting unit group 70 is formed by a plurality of red organic light-emitting units 40R, a plurality of green organic light-emitting units 40G, and a plurality of blue organic light-emitting units 40B. The organic light-emitting unit group 70 may be understood as a minimum repeating unit including a plurality of organic light-emitting units 40. In FIG. 6, the organic light-emitting unit group 70 includes two red organic light-emitting units 40R, two green organic light-emitting units 40G, and two blue organic light-emitting units 40B, which is taken as an example for description. A plurality of organic light-emitting unit groups 70 are arranged in the second direction (X-direction as shown in the figure) and the third direction (Y-direction as shown in the figure) in order so that the arrangement mode of organic light-emitting units in the entire display panel is obtained. Further, a plurality of imaging apertures 62 are arranged in an array, and along the second direction and the third direction, at least one organic light-emitting unit group 70 may be arranged between two adjacent imaging apertures 62. In FIG. 6, in the second direction, two organic light-emitting unit groups 70 are arranged between two adjacent imaging apertures 62, and in the third direction, one organic light-emitting unit group 70 is arranged between two adjacent imaging apertures 62, which is taken as an example for description. At the same time, the distance L9 between two adjacent imaging apertures 62 can satisfy that $300 \leq L9 \leq 1000$ μm. The distance between two adjacent imaging apertures 62 is suitably set so that not only the fingerprint recognition function is implemented through the imaging apertures 62, but also a high display opening ratio of the display panel is ensured. Accordingly, the display panel is avoided from low accuracy of fingerprint recognition due to a small number of imaging apertures 62, and avoided from abnormal display due to a large number of imaging apertures 62 occupying more display regions.

Further referring to FIG. 6, in the second direction (X-direction as shown in the figure), at least two organic light-emitting units groups 70 are arranged between two adjacent imaging apertures 62. In FIG. 6, as an example, only two organic light-emitting unit groups 70 are arranged between two adjacent imaging apertures 62. An area of the region where the first anode 411 overlaps the imaging aperture 62 is S1. When the first via hole 611 and the imaging aperture 62 are translated to the position of the second organic light-emitting unit 42 corresponding to the first organic light-emitting unit 41, and the first via hole 611 and the second via hole 612 are completely overlapped, an area of the region where the second anode 421 overlaps the imaging aperture 62 is S2. An area of the imaging aperture 62 is S3. (S2−S1)/S3≥20%.

As shown in FIG. 6, when the imaging aperture 62 is translated to a position of the virtual imaging aperture 62' along the X-direction, the overlapping area of the second anode 421 and the virtual imaging aperture 62' is S2. In the first direction, the distance L1 between an edge on a side of the first anode 411 facing close to the imaging aperture 62 and a center O of the first via hole 611 and the distance L2 between an edge of the second anode 421 and a center O' of the second via hole 612 are set to satisfy that L1<L2. Such setting ensures that the area S1 of the region where the first anode 411 overlaps the imaging aperture 62 is smaller than the area S2 of the region where the second anode 421 overlaps the imaging aperture 62 in the related art, and ensures that imaging aperture 62 has a large light transmission region so that more light is incident to the fingerprint recognition unit 50 through the imaging aperture 62. Specifically, the area S1 of the region where the first anode 411 overlaps the imaging aperture 62, the area S2 of the region where the second anode 421 overlaps the imaging aperture 62, and the area S3 of the imaging aperture 63 may satisfy that (S2−S1)/S3≥20%, which ensures that the light transmission region of the imaging aperture 62 is increased.

Figure 18:
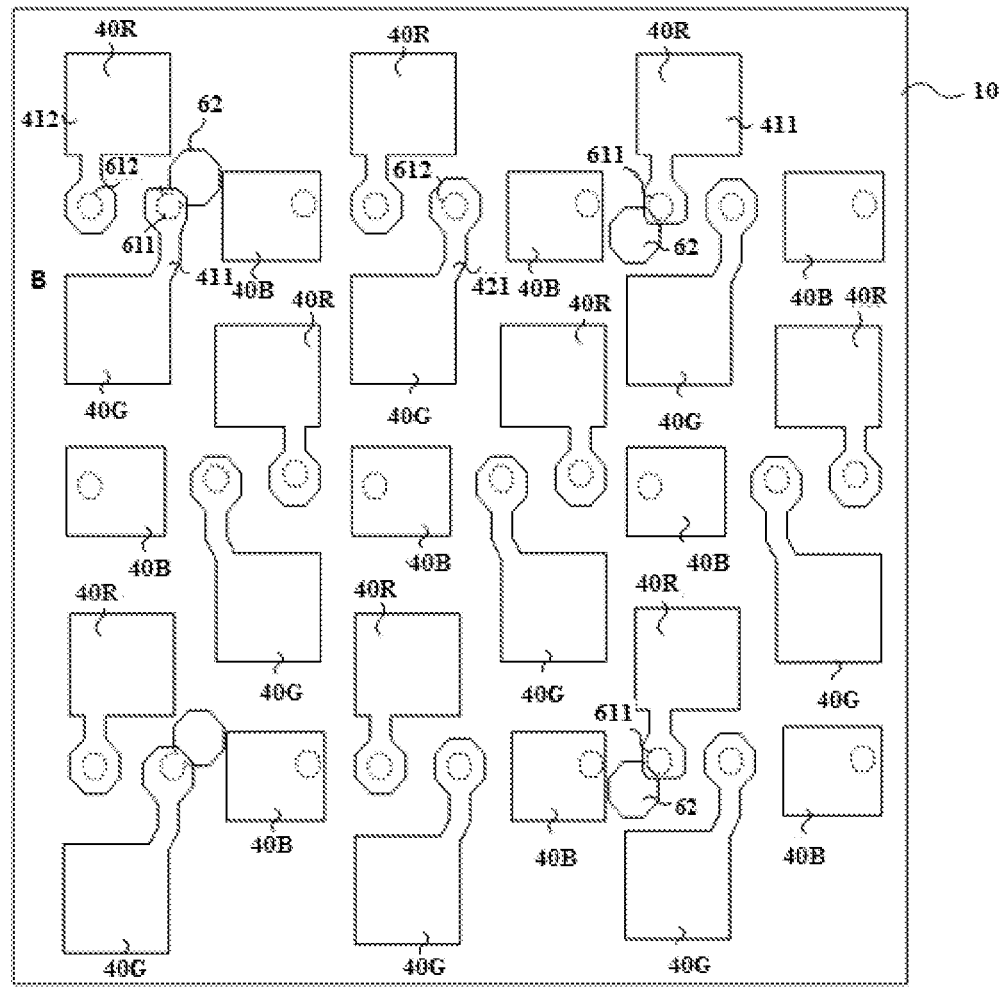
FIG. 18 is a structural diagram of another display panel according to an embodiment of the present disclosure.

FIG. 18 is a structural diagram of another display panel according to an embodiment of the present disclosure. As shown in FIG. 18, the first organic light-emitting unit 41 includes at least two of: a red organic light emitting unit 40R, a green organic light emitting unit 40G, and a blue organic light-emitting unit 40B.

Exemplarily, in FIG. 18, the first organic light-emitting unit 41 includes the red organic light-emitting unit 40R and the green organic light emitting unit 40G, which is taken as an example for description. By configuring the first organic light-emitting unit 41 to include at least two of the red organic light-emitting unit 40R, the green organic light-emitting unit 40G, and the blue organic light-emitting unit 40B, the imaging aperture 62 does not necessarily correspond to the organic light-emitting unit 40 of the same color. It is ensured that the imaging aperture 62 is provided in a flexible position and the imaging magnification ratio is provided in a flexible manner, so that fingerprint recognition operations of different requirements can be satisfied, and the function of the display panel can be diversified.

Optionally, further referring to FIG. 8, when the light-blocking layer 30 is disposed between the drive circuit 20 and the organic light-emitting unit 40, the light-blocking layer 30 may include a metal light-blocking layer. The via hole 61 and the imaging aperture 62 are formed on the metal light-blocking layer, in addition, and a PVDD voltage signal may also be accessed on the metal light-blocking layer. The PVDD voltage signal is accessed on both the metal light-blocking layer and the film layer in which the data line is disposed, that is, the metal light-blocking layer and the film layer in which the data line is arranged are connected in parallel. Therefore, the transmission loss of the PVDD signal is reduced, and the light-emitting efficiency of the display panel is improved.

Optionally, further referring to FIG. 6, the plurality of drive circuits 20 are arranged in a matrix. A vertical projection of the first organic light-emitting unit 41 and a vertical projection of a drive circuit 20 electrically connected to the first organic light-emitting unit 41 on the base substrate are staggered by a preset distance; and a vertical projection of at least a part of the second organic light-emitting units 42 on the base substrate at least partially overlaps a vertical projection of a drive circuit 20 electrically connected to the second organic light-emitting unit 42 on the base substrate.

Exemplarily, as shown in FIG. 6, the display panel includes a plurality of scan lines 81 and a plurality of data lines 82. The scan lines 81 extend in the second direction (the X-direction shown in the figure) and are arranged in the third direction (the Y-direction shown in the figure). The data lines 82 extend in the third direction and are arranged in the second direction. The second direction intersects the third direction. The plurality of scan lines 81 and the plurality of data lines 82 are insulated and crossed to define a plurality of pixel units. Each of the pixel units includes a drive circuit 20, and the drive circuit includes a thin-film transistor. The thin-film transistors of the drive circuits are arranged in a matrix along the second direction and the third direction.

Optionally, further referring to FIG. 6, the drive circuits 20 are arranged along the scan line 81 direction and the data line 82 direction in an array. The drive circuits 20 in the same row are electrically connected to the same scan line 81. Similarly, the drive circuits 20 in the same column are electrically connected to the same data line 82. Optionally, the light-emitting unit group includes the red organic light-emitting unit 40R, the green organic light-emitting unit 40G, and the blue organic light-emitting unit 40B. The red organic light-emitting unit 40R, the green organic light-emitting unit 40G, and the blue organic light-emitting unit 40B are arranged in the shape of an triangle. In this way, as shown in FIG. 6, it may be ensured that more organic light-emitting units are provided in the display panel, thereby increasing the pixel resolution of the display panel.

In other words, the red organic light-emitting unit 40R, the green organic light-emitting unit 40G, and the blue organic light-emitting unit 40B are successively and cyclically arranged in the third direction (Y-direction as shown in the figure). In the second direction (X-direction as shown in the figure), the red organic light-emitting units 40R are disposed adjacent to each other, the green organic light-emitting units 40G are disposed adjacent to each other, the blue organic light-emitting units 40B are disposed adjacent to each other, and any adjacent red organic light-emitting unit 40R, green organic light-emitting unit 40G, and blue organic light-emitting unit 40B are arranged in the shape of a triangle.

Optionally, since the organic light-emitting units 40 in the same light-emitting unit group need to be connected to the same scan/data line, an anode 51 in the opening region of the pixel definition layer of at least one organic light-emitting unit 40 in the same light-emitting unit group is disposed exactly corresponding to the source/drain of the drive circuit 20, while an anode 51 in the opening region of the pixel definition layer of at least one organic light-emitting unit 40 in the same light-emitting unit group is staggered from the source/drain of the drive circuit 20. A via hole 61 corresponding to the anode 51 staggered from the source/drain of the drive circuit 20 is used as the first via hole 611, and is disposed in communication with the imaging aperture 62, to avoid the organic light-emitting unit 40 being too close to the imaging aperture 62 and avoiding the impact of light from the organic light-emitting unit 40 on the fingerprint recognition.

Optionally, since the anode 51 in the opening region of the pixel definition layer of at least one organic light-emitting unit 40 is staggered from the source/drain of the drive circuit 20 electrically connected thereto, at least a part of the anodes 51 each include an electrode portion located in the opening region of the pixel definition layer and a connection portion connected to the electrode portion. The vertical projection of the connecting portion on the base substrate 10 overlaps the vertical projection of the via hole 61 on the base substrate 10. The electrode portion is electrically connected to the source/drain electrode of the corresponding drive circuit through the connection portion and the via hole.

It may be understood that the distance between the anode and the via hole and defined in other embodiments of the present application may be understood as the distance between the connection portion of the anode and the corresponding via hole.

The vertical projection of the first organic light-emitting unit 41 and a vertical projection of a drive circuit 20 electrically connected to the first organic light-emitting unit 41 on the base substrate are staggered by a preset distance, which may be understood as that the vertical projection of the first anode 411 and the vertical projection of the source or drain of the thin-film transistor electrically connected to the first anode 411 on the base substrate 10 are staggered by a preset distance. Further, the first anode 411 may include an electrode portion 4111 located in an opening region of a pixel defining layer (not shown in the figure) and a connection portion 4112 connected to the electrode portion 4111. A vertical projection of the connection portion 4112 and a vertical projection of the first via hole 611 on the base substrate 10 overlap, and the electrode portion 4111 is electrically connected to the drive circuit 20 through the connection portion 4112 and the first via hole 611. Therefore, the vertical projection of the first anode 411 and the vertical projection of the source or drain of the thin-film transistor electrically connected to the first anode 411 on the base substrate 10 are staggered by a preset distance, which may be further understood as that the vertical projection of the electrode portion 4111 and the vertical projection of the source or drain of the thin-film transistor electrically connected to the electrode portion 4111 on the base substrate 10 are staggered by a preset distance. The electrode portion 4111 is electrically connected to the drive circuit 20 through the connection portion 4112 and the first via hole 611, as shown in 40G in FIG. 6. It may be understood that the preset distance here is greater than zero.

Optionally, a vertical projection of each of at least a part of the second organic light-emitting units 42 on the base substrate 10 at least partially overlaps a vertical projection of a drive circuit 20 electrically connected to the each of at least a part of second organic light-emitting units 42 on the base substrate 10, which may be understood as that a vertical projection of each of at least a part of the anodes 42 on the base substrate at least partially overlaps a vertical projection of a source or a drain of the thin-film transistor electrically connected to the each of at least a part of the second anodes on the base substrate 10. Specifically, a vertical projection of the second anode 42 on the base substrate 10 may at least partially overlap a vertical projection of a source or a drain of the thin-film transistor electrically connected to the second anode 42 on the base substrate 10, as shown in 40B in FIG. 6. Or the vertical projection of the connection portion of the second anode 421 on the base substrate 10 overlaps the vertical projection of the source or the drain of the thin-film transistor electrically connected to the connection portion of the second anode 421 on the base substrate 10, as shown in 40R in FIG. 6.

Optionally, further referring to FIG. 8, the display panel provided in the embodiment of the present disclosure may further include a first passivation layer 91, a second passivation layer 92 and a planarization layer 93 successively arranged between a film layer in which the drive circuit 20 is located and a film layer in which the organic light-emitting unit 40 is located. The first passivation layer 91 is an inorganic layer, and the second passivation layer 92 and the planarization layer 93 each are an organic layer. The first via hole 611 is penetrated through the first passivation layer 91, the second passivation layer 92 and the planarization layer 93. A first opening 94 is formed in the first passivation layer 91, a second opening 95 is formed in the second passivation layer 92, and a third opening 96 is formed in the planarization layer 93. An area S4 of the first opening 94, an area S5 of the second opening 95, and an area S6 of the third opening 96 satisfy that S4>S5 and S5=S6.

As shown in FIG. 8, the coupling capacitance between the film layer in which the source is located and the light-blocking layer 30 is reduced by providing the first passivation layer 91 and the second passivation layer 92 between the driving circuit 20 and the light-shielding layer 30. Thus, the impact on the display signal is small, and the display panel is guaranteed to have a good display effect. At the same time, since the first passivation layer 91 is an inorganic layer, the cross section of the first opening 94 may be rough and not smooth in the process of forming the first opening 94, which affects the connection of the anode to the drive circuit 20. In the embodiment of the present disclosure, the area S4 of the first opening 94 is provided larger than the area S5 of the second opening 95, and when the second passivation layer 92 is prepared, the organic material used by the second passivation layer 92 may be deposited on the cross section of the first opening 94. The cross section of the first opening 94 is guaranteed to be smooth, and an effect of the connection between the anode and the drive circuit 20 is ensured to be good.

Optionally, in the display panel provided in the embodiment of the present disclosure, the organic light-emitting unit 40 may be a light source of the fingerprint recognition unit 50, so that the display panel does not need to be separately provided with a light source for the fingerprint recognition unit 50, the structure of the display panel is simple, and the film layer relationship is simple, which is easy for implementing the lightening design of the display panel. Alternatively, the display panel provided in the embodiment of the present disclosure may further include a light source for fingerprint recognition (not shown in the figure), and the light source for fingerprint recognition provides a light source for the fingerprint recognition unit 50 to ensure that the fingerprint recognition unit 50 may have a plurality of functions. For example, the light source for fingerprint recognition may be an infrared light source, so that the fingerprint recognition unit 50 can identify the blood flow condition of the human body in addition to the fingerprint recognition, and monitor the health of the human body.

Figure 19:
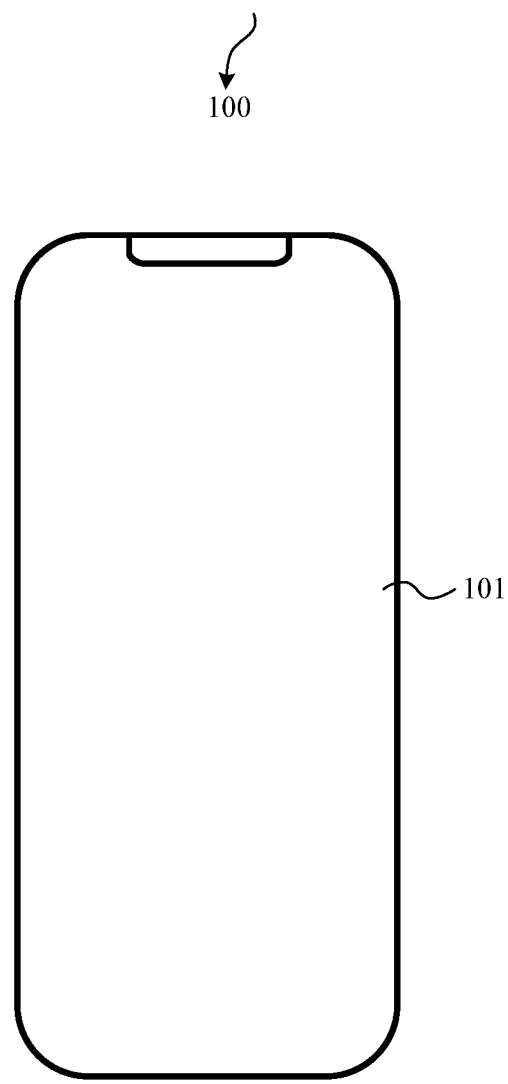
FIG. 19 is a schematic diagram of a display device according to an embodiment of the present disclosure.

Based on the same inventive concept, an embodiment of the present disclosure further provides a display device. FIG. 19 is a schematic diagram of the display device according to the embodiment of the present disclosure. The display device 100 provided in the embodiment of the present disclosure includes the display panel 101 described in any embodiment of the present disclosure. Optionally, the display device provided in the embodiment of the present disclosure may be a mobile phone shown in FIG. 19, or may be a computer, a television, an smart wearable display device, or the like, which is not specifically limited in the embodiment of the present disclosure.

It is to be noted that the above are merely preferred embodiments of the present disclosure and the technical principles used therein. It will be understood by those skilled in the art that the present disclosure is not limited to the specific embodiments described herein, and that the features of the various embodiments of the present disclosure may be coupled or combined in part or in whole with one another, and may be collaborated with one another and technically driven in various ways. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising a base substrate, a plurality of drive circuits, a light-blocking layer, a plurality of organic light-emitting units and a plurality of fingerprint recognition units arranged on a side of the light-blocking layer facing away from the organic light-emitting units, wherein the base substrate, the plurality of drive circuits, the light-blocking layer, and the plurality of organic light-emitting units are successively stacked, wherein a plurality of via holes and a plurality of imaging apertures are formed in the light-blocking layer; the via holes comprise first via holes and second via holes, wherein at least one of the first via holes is in communication with one of the imaging apertures; and light reflected by a touch body is incident to one of the fingerprint recognition units through at least one of the imaging apertures;

wherein the organic light-emitting units comprise first organic light-emitting units and second organic light-emitting units, wherein each of the first organic light-emitting units comprises a first anode, and each of the second organic light-emitting units comprises a second anode; the first anode of each of the first organic light-emitting units is electrically connected to one of the drive circuits through one of the first via holes, and the second anode of each of the second organic light-emitting units is electrically connected to one of the drive circuits through one of the second via holes; and wherein in a first direction, a distance between an edge on a side of the first anode facing close to an imaging aperture and a center of the first via hole that is in communication with the imaging aperture is L1, a distance between an edge of the second anode and a center of one of the second via holes is L2, and L1<L2, wherein the first direction is parallel to a connection line between the center of the first via hole and the center of the imaging aperture.

2. The display panel of claim 1, wherein an entire vertical projection of each of the first via holes on the base substrate is within a vertical projection of the first anode of one of the first organic light-emitting units on the base substrate;

an entire vertical projection of each of the second via holes on the base substrate is within a vertical projection of the second anode of one of the second organic light-emitting units on the base substrate; and a minimum distance between an edge of each of the first via holes and an edge of the first models L3, and a minimum distance between an edge of each of the second via holes and an edge of the second anode is L4, wherein L3<L4.

3. The display panel of claim 2, wherein O<L3<2 pm, and 3<L4<5 pm.

4. The display panel of claim 2, wherein a distance between an edge on a side of each of the first via holes facing close to the imaging aperture that is communication with the first via hole and an edge on the side of the first anode facing close to the imaging aperture is L5, and a distance between an edge on a side of the first via hole facing away from the imaging aperture and an edge on a side of the first anode facing away from the imaging aperture is L6, wherein L5<L6.

5. The display panel of claim 2, wherein a distance between an edge on a side of each of the first via holes facing close to the imaging aperture that is communication with the first via hole and an edge on the side of the first anode facing close to the imaging aperture is L7, and a distance between an edge on a side of the first via hole facing away from the imaging aperture and an edge on a side of the first anode facing away from the imaging aperture is L8, wherein L7=L8.

6. The display panel of claim 1, wherein a part of a vertical projection of each of the first via holes on the base substrate is within a vertical projection of the first anode on the base substrate;

the edge on the side of the first anode facing close to the imaging aperture that is in commutation with the first via hole is located on a side of the center of the first via hole facing close to the imaging aperture, or passes through the center of the first via hole; or is located on a side of the center of the first via hole facing away from the imaging aperture.

7. The display panel of claim 1, wherein the first organic light-emitting units comprises a red organic light-emitting unit, a green organic light-emitting unit or a blue organic light-emitting unit.

8. The display panel of claim 7, wherein an organic light-emitting unit group is formed by a plurality of red organic light-emitting units, a plurality of green organic light-emitting units, and a plurality of blue organic light-emitting units; and the plurality of imaging apertures are arranged in an array, and at least one organic light-emitting unit group is arranged between two adjacent imaging apertures.

9. The display panel of claim 8, wherein at least two organic light-emitting unit groups are arranged between two adjacent imaging apertures;

an area of a region where the first anode overlaps one of the imaging apertures is Si;

when one of the first via holes and one of the imaging apertures are translated to a position where one of the second organic light-emitting units corresponding to one of the first organic light-emitting units is located, and the first via hole and the second via hole completely overlap, an area of a region where the second anode overlaps the imaging aperture is S2; and an area of each of the imaging apertures is S3;

wherein (S2−S1)/S3≥20%.

10. The display panel of claim 1, wherein the first organic light-emitting units comprise at least two of: a red organic light-emitting unit, a green organic light-emitting unit and a blue organic light-emitting unit.

11. The display panel of claim 1, wherein a total number of the first organic light-emitting units is N1, and a total number of the second organic light-emitting units is N2, wherein N1/N2<1:99.

12. The display panel of claim 1, wherein a distance between two adjacent imaging apertures is L9, wherein 300<L9<1000 μm.

13. The display panel of claim 1, wherein the light-blocking layer comprises a metal light-blocking layer.

14. The display panel of claim 1, wherein the plurality of drive circuits are arranged in a matrix;
a vertical projection of each of the first organic light-emitting units on the base substrate and a vertical projection of one of the drive circuits electrically connected to the first organic light-emitting unit on the base substrate are staggered by a preset distance; and
a vertical projection of at least part of the second organic light-emitting units on the base substrate at least partially overlaps a vertical projection of one of the drive circuits electrically connected to the part of second organic light-emitting units on the base substrate.

15. The display panel of claim 14, wherein the display panel comprises a plurality of scan lines and a plurality of data lines, the scan lines extend in a second direction and are arranged in a third direction, and the data lines extend in the third direction and are arranged in the second direction; the second direction and the third direction intersect;
the plurality of scan lines and the plurality of data lines are insulated and crossed to define a plurality of pixel units, each of the pixel units comprises one of the drive circuits, and each of the drive circuits comprises a thin-film transistor, the thin-film transistors of the drive circuits are arranged in a matrix along the second direction and the third direction;
a vertical projection of the first anode on the base substrate and a vertical projection of a source electrode or a drain electrode of a thin-film transistor electrically connected to the first anode on the base substrate are staggered by the preset distance; and
a vertical projection of at least part of second anodes on the base substrate at least partially overlaps a vertical projection of a source electrode or a drain electrode of thin-film transistors electrically connected to the part of second anodes on the base substrate.

16. The display panel of claim 15, wherein the first anode comprises an electrode portion located in an opening region of a pixel defining layer and a connection portion connected to the electrode portion, and a vertical projection of the connection portion and a vertical projection of one of the first via holes on the base substrate overlap, and the electrode portion is electrically connected to one of the drive circuits through the connection portion and one of the first via holes.

17. The display panel of claim 16, wherein the organic light-emitting units comprise a red organic light-emitting unit, a green organic light-emitting unit and a blue organic light-emitting unit, wherein the red organic light-emitting unit, the green organic light-emitting unit and the blue organic light-emitting unit are arranged in a shape of a triangle.

18. The display panel of claim 1, further comprising a first passivation layer, a second passivation layer and a planarization layer successively disposed between a film layer in which the drive circuits are located and a film layer in which the organic light-emitting units are located, wherein the first passivation layer is an inorganic layer, and the second passivation layer and the planarization layer each are an organic layer;
wherein each of the first via holes is penetrated through the first passivation layer, the second passivation layer and the planarization layer, a first opening is formed in the first passivation layer, a second opening is formed in the second passivation layer, and a third opening is formed in the planarization layer; and an area S4 of the first opening, an area S5 of the second opening, and an area S6 of the third opening satisfy that S4>S5 and S5=S6.

19. The display panel of claim 1, wherein the organic light-emitting units are a light source of the fingerprint recognition units; or
the display panel further comprises a light source for fingerprint recognition.

20. A display device comprising a display panel, wherein the display panel comprises a base substrate, a plurality of drive circuits, a light-blocking layer, a plurality of organic light-emitting units and a plurality of fingerprint recognition units arranged on a side of the light-blocking layer facing away from the organic light-emitting units, wherein the base substrate, the plurality of drive circuits, the light-blocking layer, and the plurality of organic light-emitting units are successively stacked,
wherein a plurality of via holes and a plurality of imaging apertures are formed in the light-blocking layer; the via holes comprise first via holes and second via holes, wherein each of the first via holes is in communication with one of the imaging apertures; and light reflected by a touch body is incident to one of the fingerprint recognition units through one of the imaging apertures;
wherein the organic light-emitting units comprise first organic light-emitting units and second organic light-emitting units, wherein each of the first organic light-emitting units comprises a first anode, and each of the second organic light-emitting units comprises a second anode; the first anode of each of the first organic light-emitting units is electrically connected to one of the drive circuits through one of the first via holes, and the second anode of each of the second organic light-emitting units is electrically connected to one of the drive circuits through one of the second via holes; and
wherein in a first direction, a distance between an edge on a side of the first anode facing close to an imaging aperture and a center of the first via hole that is in communication with the imaging aperture is L1, a distance between an edge of the second anode and a center of one of the second via holes is L2, and L1<L2, wherein the first direction is parallel to a connection line between the center of the first via hole and the center of the imaging aperture.

* * * * *